Figure 1:
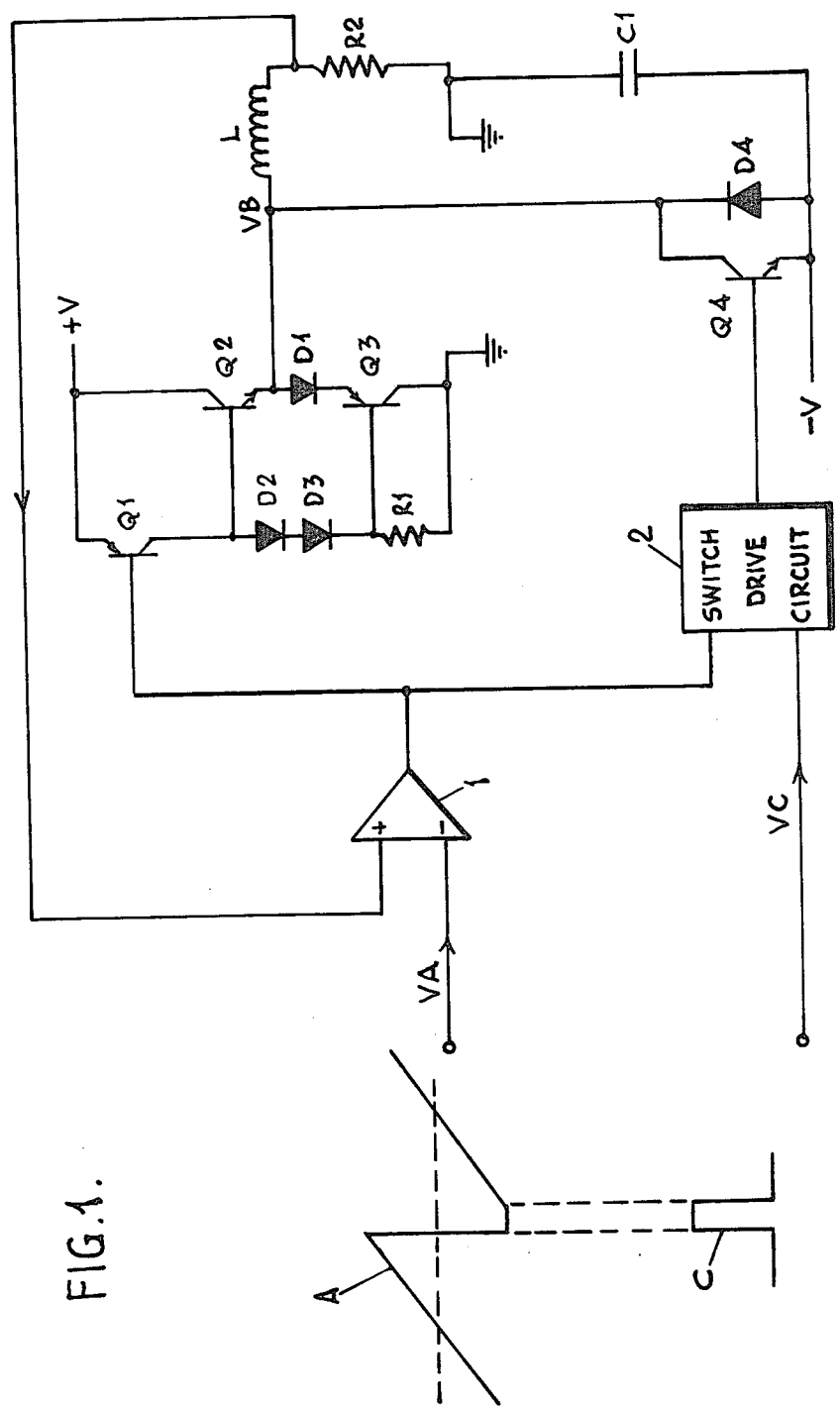

United States Patent [19]

Ovenden

[11] 4,100,464
[45] Jul. 11, 1978

[54] ELECTRIC AMPLIFYING ARRANGEMENTS

[75] Inventor: Charles William Ovenden, Strood, England

[73] Assignee: Elliott Brothers (London) Limited, Chelmsford, England

[21] Appl. No.: 714,319

[22] Filed: Aug. 16, 1976

[30] Foreign Application Priority Data

Aug. 29, 1975 [GB] United Kingdom ............... 35724/75

[51] Int. Cl.$^2$ ........................ H01J 29/70; H01J 29/76
[52] U.S. Cl. ...................................... 315/397; 315/387
[58] Field of Search ............... 315/396, 397, 389, 407, 315/410, 387

[56] References Cited

U.S. PATENT DOCUMENTS

| | | | |
|---|---|---|---|
| 3,781,589 | 12/1973 | Brockmann | 315/397 |
| 3,786,303 | 1/1974 | Hilburn | 315/397 |
| 3,983,452 | 9/1976 | Bazin | 315/397 |
| 3,993,930 | 11/1976 | Fischman et al. | 315/397 |

Primary Examiner—Maynard R. Wilbur
Assistant Examiner—T. M. Blum
Attorney, Agent, or Firm—Kirschstein, Kirschstein, Ottinger & Cobrin

[57] ABSTRACT

An electric amplifying arrangement for supplying current to an inductive load in response to an input signal of saw-tooth waveform, e.g. a deflection amplifier for a cathode ray tube, wherein during the ramp portion of the input voltage a linear relation is maintained between variation in the load current and the input signal (i.e. Class A operation occurs) and, during flyback, energy recovery is provided, thereby providing higher efficiency than is obtained with known Class A saw-tooth amplifiers.

8 Claims, 2 Drawing Figures

ELECTRIC AMPLIFYING ARRANGEMENTS

This invention relates to electric amplifying arrangements.

More particularly, the invention relates to electric amplifying arrangements of the kind suitable for supplying a current to an inductive load in response to an input signal of saw-tooth waveform. Such amplifiers find application, for example, as line output circuits in television receivers.

Known such arrangements fall intwo two classes; those which operate efficiently but provide poor control of their output; and those which provide effective control of their output but operate inefficiently.

It is an object of the present invention to provide an electric amplifying arrangement of the kind specified which may be arranged to operate efficiently and provide good control.

According to the present invention, an electric amplifying arrangement for supplying current to an inductive load in response to an input signal of saw-tooth waveform comprises: a first controllable electronic switching device connected between the load and a source of current for said load of one polarity; a second controllable electronic switching device connected between the load and a source of current of the opposite polarity; a first discharge path for discharging energy supplied to said load via said first switching device; a second discharge path including a third controllable electronic switching device for discharging energy supplied to said load via said second switching device; and control means for closing said third and first switching devices consecutively during the ramp portion of the input signal, and closing said second switching device during the latter part of the flyback portion of the input signal.

Preferably said first discharge path includes a capacitance which receives energy from the load when the first switching device opens, and supplies said energy to said load via said second switching device when said second switching device closes.

Preferably the control means is arranged to control the discharge of energy from the load through the third switching device, and the supply of energy to the load through the first switching device in dependence upon consecutive first and second parts of the ramp portion of the input signal respectively.

For example, the control means may include a differential amplifier arranged to control the switching potentials applied to the first and third switching devices in dependence upon the input signal, and in dependence upon a negative feedback signal representing the current passing through the load, whereby to maintain a linear dependence between the variation in the load current and the input signal during the said first and second parts of the ramp portion of the input signal.

The switching potentials applied in operation to said first and third switching devices may conveniently be derived by means of a fourth controllable electronic switching device controlled by the output of the differential amplifier to operate as a class A amplifier.

In a preferred arrangement in accordance with the invention said load has one end connected to a point maintained at a first potential in operation, said first switching device is connected between the other end of the load and a point maintained in operation at a second potential of said one polarity with respect to said first potential; said second switching device is connected between said other end of the load and a point maintained in operation at a third potential of said opposite polarity with respect to said first potential; said third switching device is connected between said other end of the load and a point maintained at said first potential, and said first discharge path incorporates a unidirectional conducting device connected in parallel with said second switching device.

Figure 2:
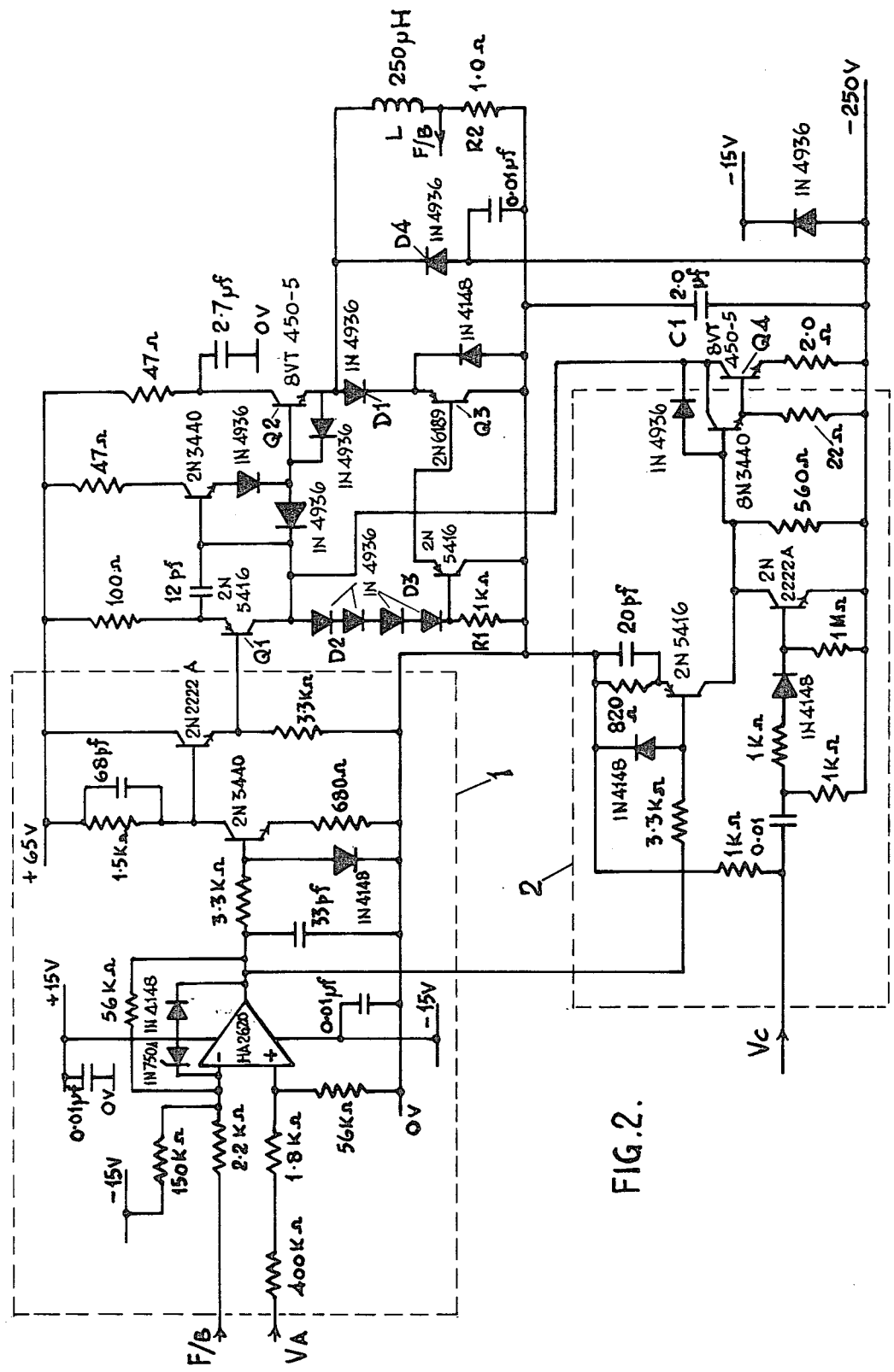

One arrangement in accordance with the invention will now be described by way of example, with reference to the accompanying drawings in which FIG. 1 is a schematic diagram of the arrangement; and FIG. 2 is a circuit diagram of one embodiment of the arrangement of FIG. 1.

Referring to FIG. 1, the arrangement includes a differential amplifier 1 having an inverting input to which a drive voltage VA derived from a waveform generator (not shown) is applied, the drive voltage having a waveform as indicated at A.

The output of the amplifier 1 is applied to the base of a PNP transistor Q1 whose collector is connected to earth via two rectifying diodes D2 and D3 and a resistor R1 connected in series, and whose emitter is connected to a positive voltage rail +V.

The collector of the transistor Q1 is further connected to the base of an NPN transistor Q2 whose collector is connected to the positive rail +V and whose emitter is connected via a rectifying diode D1 to the emitter of a PNP transistor Q3 whose emitter is connected to earth and whose base is connected to the junction between the diode D3 and the resistor R1.

The emitter of transistor Q2 is further connected to one end of an inductive load L, which may for example be the line scan coils of a cathode ray tube. The other end of the load L is connected to earth via a resistor R2, the unearthed end of the resistor being connected to the noninverting input of the amplifier 1 to provide negative feedback.

The end of the load L remote from earth is further connected to the collector of an NPN transistor Q4 whose emitter is connected to a negative rail −V, a capacitor C1 being connected between the −V rail and earth.

A rectifier diode D4 is connected between the emitter and collector of the transistor Q4, and the base of the transistor Q4 is connected to the output of a switch drive circuit 2 having two inputs, one connected to the output of the amplifier 1 and the other supplied with a voltage VC from the waveform generator, which voltage essentially comprises a short pulse occurring during the blanking period at the end of the flyback portion of the voltage applied to the amplifier 1, as shown in waveform C in the drawing.

It will be understood that the arrangement also includes quiescent biassing arrangements for the transistors, but the components for this are omitted for the sake of simplicity.

The operation of the arrangement is as follows:

During the second half of the ramp portion of the drive voltage VA applied to the amplifier 1 transistor Q1 operates in Class A to control transistor Q2 and allow current to flow from the rail +V through the load L via transistor Q2 and to increase in dependence on the drive voltage VA. During this time the negative feedback voltage applied to the amplifier 1 from the resistor R2 maintains a linear increase in the current in the load L in known manner.

When the flyback portion of the drive voltage VA starts Q1 switches off. Q2 consequently starts to switch off causing the potential VB at the unearthed end of the load L to swing violently negative as the load L attempts to charge its self capacity. When the potential VB exceeds the potential of the negative rail $-V$ the diode D4 conducts so that the components R2, C1 and D4 provide a discharge path for the load L and current in the load L drops at a rate determined by the ratio of the values of the potential of the rail $-V$ and the load inductance.

Sometime before the energy in the load L is completely discharged the transistor Q4 is switched on in response to the pulse in voltage VC and current flows from earth through the load L to the rail $-V$ via the transistor Q4, the current increasing at the same rate as it decreased during the preceding discharge. When the current becomes sufficiently large the voltage across the resistor R2 catches up with the baseline of the drive voltage VA and the resulting change in the output of the amplifier 1 switches off the transistor Q4. The potential VB consequently swings violently positive driving current through the diode D1 and transistor Q3. In this situation, with VB close to earth potential the current in the load L would follow the baseline of drive voltage VA. However, as VA starts along the ramp portion of its waveform, transistor Q1 comes on. Throughout the first half of the ramp portion of the drive voltage transistor Q1 controls the base potential of transistor Q3 via components D1, D2 and R1. Hence, diode D1 and transistor Q3 provide a discharge path for the load L and current in the load drops off at a rate determined by the drive voltage VA. When the energy in the load is discharged current starts to flow in the opposite direction in the load from the positive rail $+V$ via transistor Q2 under the control of the drive voltage, as described above, thus completing the cycle of operation.

It will be seen that during the ramp portion of the drive voltage load current is controlled by components Q1, Q2, Q3, D1, D2, D3 and R1, transistor Q1 operating in Class A so that effective control of the output can be achieved.

During flyback control is effected by components Q3 and D4 and energy recovery is effected by means of capacitor C1, thus increasing the efficiency of the arrangement over conventional Class A arrangements.

The energy flow taking place in the arrangement is as follows.
(a) From $+V$ via transistor Q2 into L
(b) From L into C1
(c) From C1 back into L
(d) From L into transistor Q3 where it is dissipated.

Thus, in theory, power is drawn from the rail $+V$ only and is dissipated only via transistor Q3.

It will be understood in this connection that the source of potential for the $-V$ rail will be required to be of high impedance relative to capacitor C1 in order that energy recovery may be effected by means of capacitor C1.

In a modification of the arrangement shown in the drawing provision may be made for recovering the energy flowing out of the load during the first half of the ramp portion of the drive voltage, instead of dissipating it via the transistor Q3, thus increasing efficiency. However, the increase in complexity is such as to render such a modification uneconomic in normal circumstances.

In this connection it is pointed out that in the arrangement shown in the drawing the two transistors Q2 and Q4 which are subjected to full $+V$ rail to $-V$ rail voltage and high switching rates and currents operate at low power dissipation and are both NPN transistors; normally the same type can be used for both transistors. Moreover, the transistor Q3 through which all the power is dissipated is subjected only to the relatively low voltage between the $+V$ rail and earth. It will be appreciated that the scan speed is proportional to the potential of the $+V$ rail, whilst as mentioned above, the flyback speed is proportional to the potential of the $-V$ rail. Typically the potential of the $-V$ rail is five to ten times the potential of the $+V$ rail.

It will be appreciated that whilst the switch drive circuit is required to turn the transistor Q4 off rapidly, it has half the flyback period in which to turn on the transistor Q4 in response to transistor Q1 cutting off, since during the first half of the flyback period the load is discharging via the diode D4. Hence design of the switch drive circuit 2 does not present a difficult problem. The slow turn on characteristic of the switch drive circuit 2 assists also in preventing transistor Q4 being turned on by transients occuring during the scan period. The switch drive circuit 2 preferably includes means for preventing the transistor Q4 being turned on by transients in the drive voltage waveform during the blanking period immediately following switch off of transistor Q4 when the potential VB catches the drive voltage baseline, as described above.

In order to overcome voltage and Miller problems, the single transistor Q1 may be replaced by a cascode arrangement.

FIG. 2 shows a circuit diagram of one embodiment of the arrangement of FIG. 1 showing component values and types corresponding components in FIGS. 1 and 2 being given the same reference.

I claim:
1. An electric amplifying arrangement for supplying current to an inductive load in response to an input signal of saw-tooth waveform comprising:
   (A) a first controllable electronic switching device connected between said load and a source of current for said load of one polarity;
   (B) a second controllable electronic switching device connected between said load and a source of current for said load of the opposite polarity;
   (C) a first discharge path connected with said load to discharge energy supplied to said load via said first switching device;
   (D) a second discharge path
      (i) including a third controllable electronic switching device connected with said load to discharge energy supplied to said load via said second switching device; and
   (E) control means responsive to said input signal to close said third and first switching devices during consecutive first and second parts of the ramp portion of the input signal respectively, and to close said second switching device during the latter part of the flyback portion of the input signal;
   (F) said control means so controlling the discharge of energy from the load through the third switching device, and the supply of current to the load through the first switching device, that a linear relation is maintained between the variation in the load current and the input signal during the said first and second parts of the ramp portion of the input signal.

2. An electric amplifying arrangement according to claim 1, wherein said first discharge path includes a capacitance which receives energy from the load when the first switching device opens, and supplies said energy to said load via said second switching device when said second switching device closes.

3. An electric amplifying arrangement according to claim 1, wherein said control means includes a differential amplifier which controls the switching potentials applied to the first and third switching devices in dependence upon the input signal, and in dependence upon a negative feedback signal representing the current passing through the load.

4. An electric amplifying arrangement according to claim 3, wherein the switching potentials applied in operation to said first and third switching devices are derived by a fourth controllable electronic switching device controlled by the output of the differential amplifier to operate as a class A amplifier.

5. An electric amplifying arrangement according to claim 1, wherein said load has one end connected to a point maintained at a first potential in operation, said first switching device is connected between the other end of the load and a point maintained in operation at a second potential of said one polarity with respect to said first potential; said second switching device is connected between said other end of the load and a point maintained in operation at a third potential of said opposite polarity with respect to said first potential; said third switching device is connected between said other end of the load and a point maintained at said first potential, and said first discharge path incorporates a unidirectional conducting device connected in parallel with said second switching device.

6. An electric amplifying arrangement according to claim 5, wherein said controllable electronic switching devices are transistors.

7. An electric amplifying arrangement according to claim 6, wherein said first and second switching devices are NPN transistors.

8. An electric amplifying arrangement according to claim 7, wherein said first and second switching devices are identical.

* * * * *